(12) United States Patent
Best et al.

(10) Patent No.: US 9,806,481 B2
(45) Date of Patent: Oct. 31, 2017

(54) TERMINAL ROW FOR A TERMINAL DEVICE

(71) Applicant: Phoenix Contact GmbH & Co. KG, Blomberg (DE)

(72) Inventors: Frank Best, Bueckeburg (DE); Eduard Unger, Bielefeld (DE); Joerg Soefker, Lemgo (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 15/032,059

(22) PCT Filed: Oct. 17, 2014

(86) PCT No.: PCT/EP2014/072285
§ 371 (c)(1),
(2) Date: Apr. 26, 2016

(87) PCT Pub. No.: WO2015/062877
PCT Pub. Date: May 7, 2015

(65) Prior Publication Data
US 2016/0268748 A1   Sep. 15, 2016

(30) Foreign Application Priority Data
Oct. 28, 2013 (DE) .................. 10 2013 111 867

(51) Int. Cl.
*H01R 12/00* (2006.01)
*H01R 27/02* (2006.01)
*H01R 9/24* (2006.01)

(52) U.S. Cl.
CPC ........... *H01R 27/02* (2013.01); *H01R 9/2408* (2013.01); *H01R 9/2466* (2013.01)

(58) Field of Classification Search
CPC .... H01R 71/10; H01R 71/0207; H01R 11/02; H01R 11/04
(Continued)

(56) References Cited

U.S. PATENT DOCUMENTS 7,658,653 B2 * 2/2010 Diekmann ......... H01H 85/2045
439/715
2003/0077932 A1 * 4/2003 Lewinnek .......... H01R 13/6315
439/246
(Continued)

FOREIGN PATENT DOCUMENTS

DE     3884329 T2   2/1994
DE    19630860 C1  10/1997
(Continued)

*Primary Examiner* — Phuong Chi T Nguyen
(74) *Attorney, Agent, or Firm* — Leydig, Voit & Mayer, Ltd.

(57) ABSTRACT

A terminal row for a terminal device, which can be attached to an electronics housing in an insertion direction and which can be connected to an electronic component that is to be accommodated in the electronics housing, has a predetermined number of single electrical conductors or connectors connected thereto to produce a connection between the single electrical conductors or connectors and the electronic component. The terminal row includes a plurality of main housings, at least two of the plurality of main housings being different, wherein the main housings are separate from one another in a pre-assembly state and configured to be attached to one another in a row direction to form the terminal row.

22 Claims, 12 Drawing Sheets

(58) Field of Classification Search
USPC .................................................. 439/76.1, 709
See application file for complete search history.

(56) References Cited

U.S. PATENT DOCUMENTS

| | | |
|---|---|---|
| 2005/0170678 A1 | 8/2005 | Donahue, IV |
| 2009/0305540 A1 | 12/2009 | Stadler et al. |
| 2011/0092101 A1 | 4/2011 | Sick et al. |

FOREIGN PATENT DOCUMENTS

| | | |
|---|---|---|
| DE | 102008027399 A1 | 12/2009 |
| DE | 102011055920 B3 | 5/2013 |
| WO | WO 2007010270 A1 | 1/2007 |
| WO | WO 2008019833 A1 | 2/2008 |

* cited by examiner

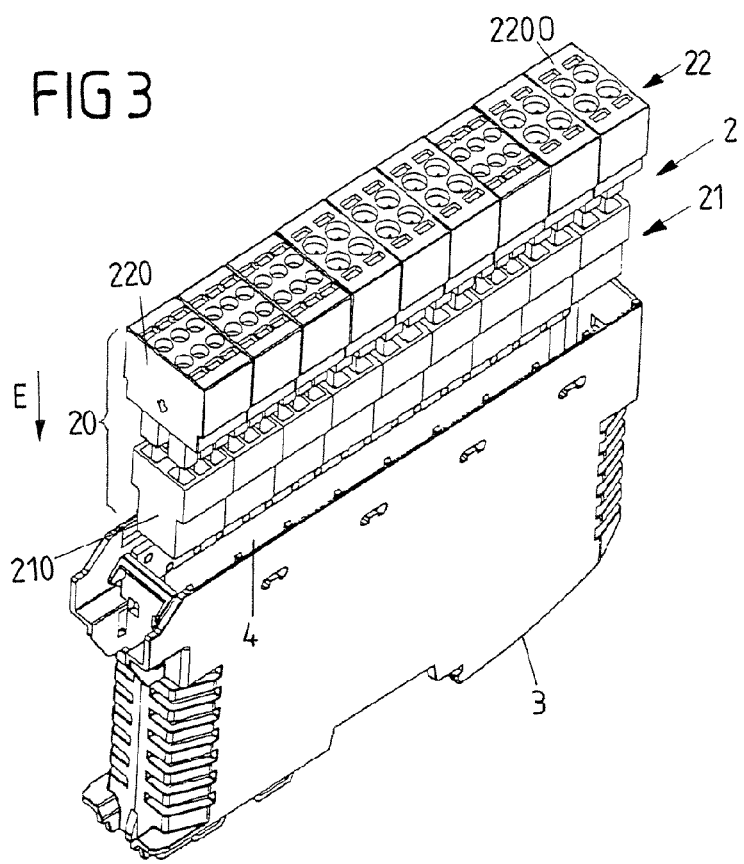
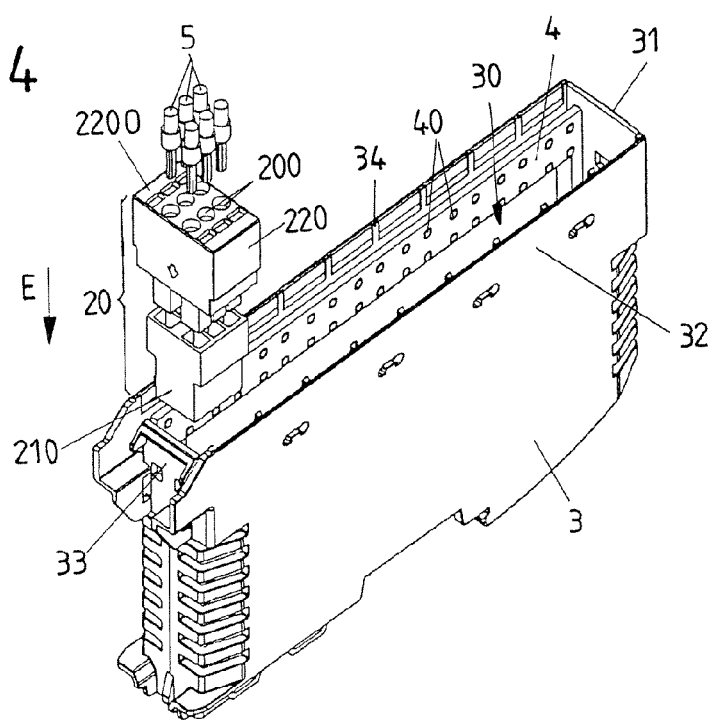

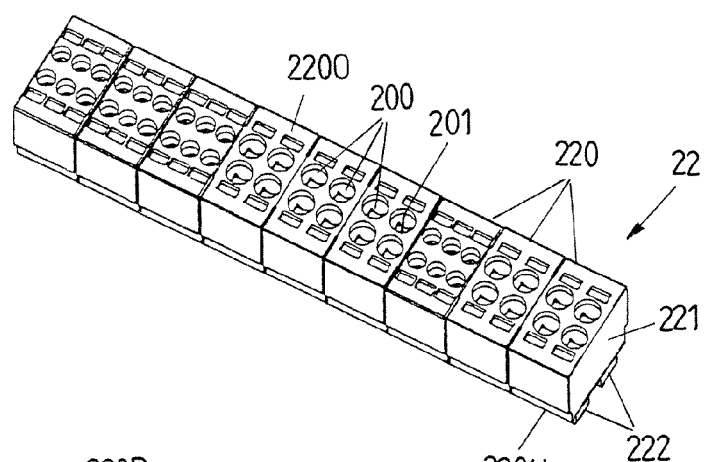
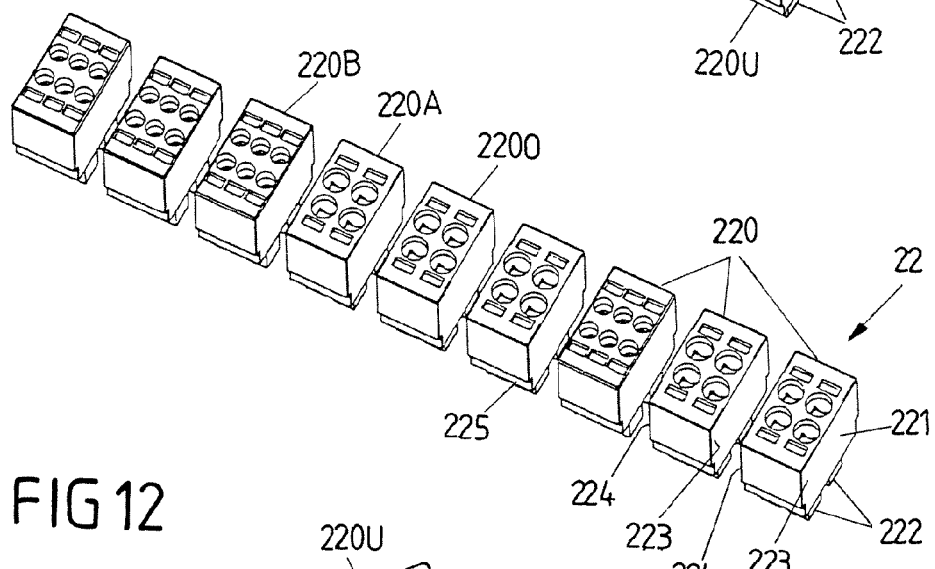
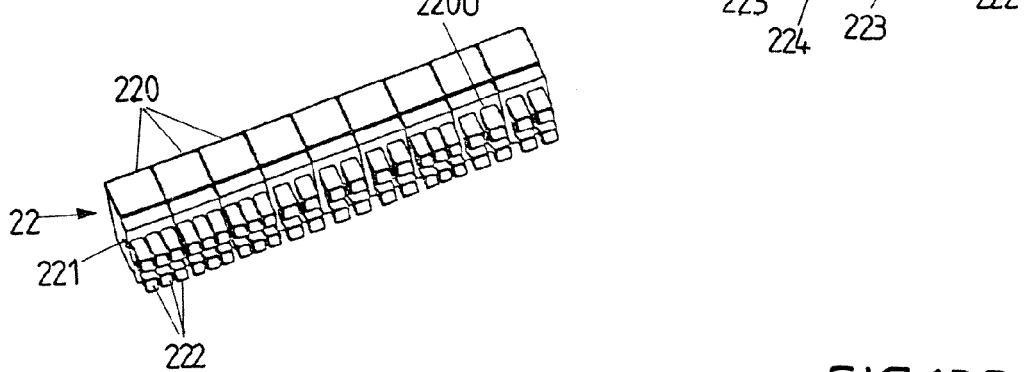
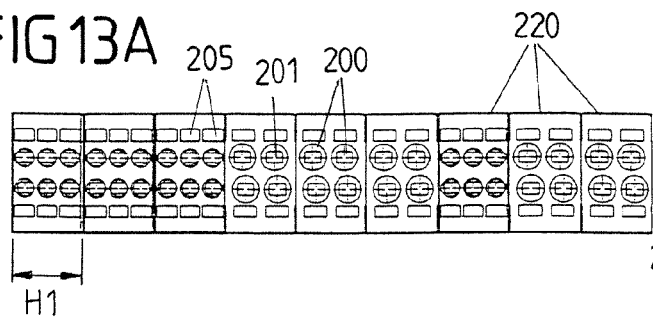
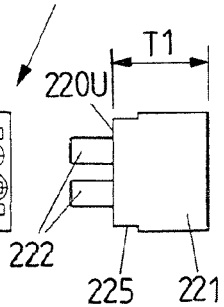

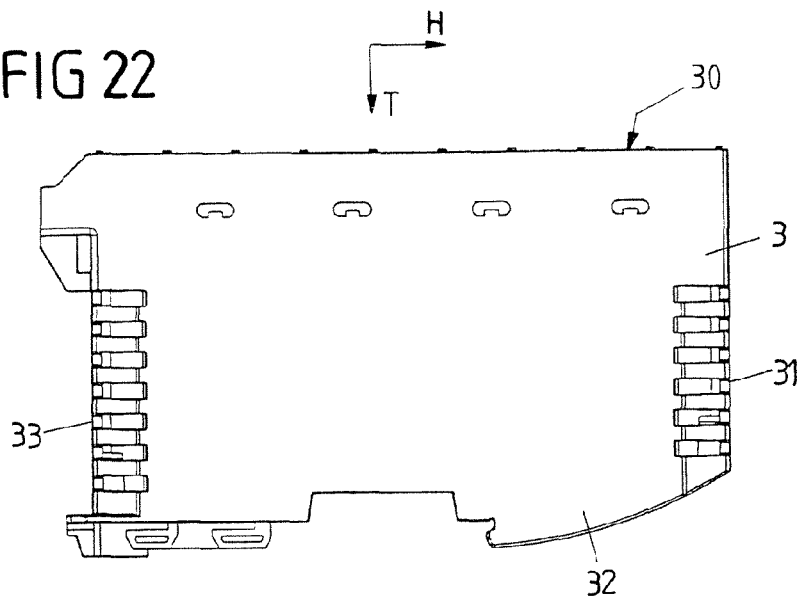
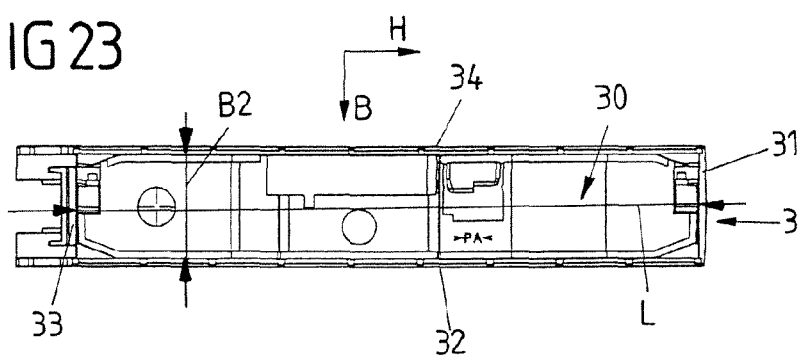
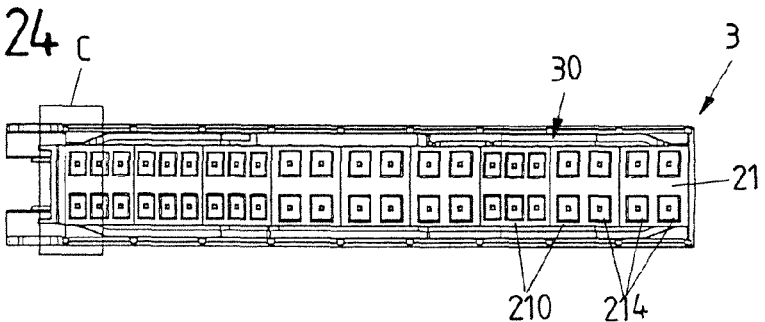
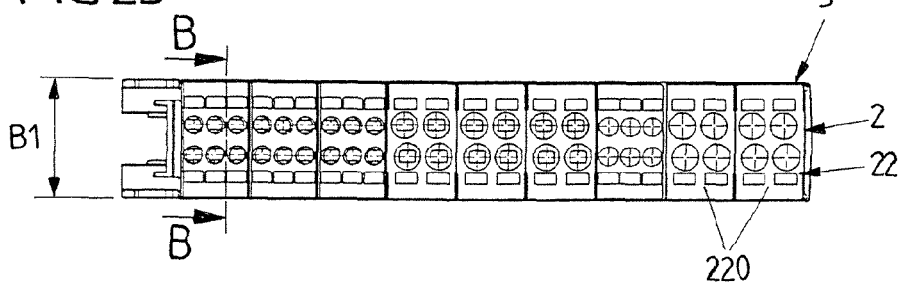

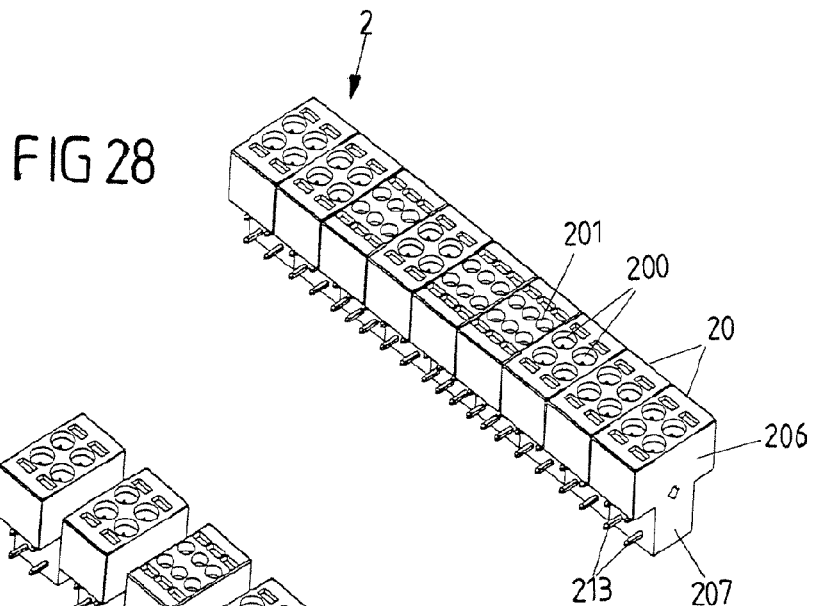
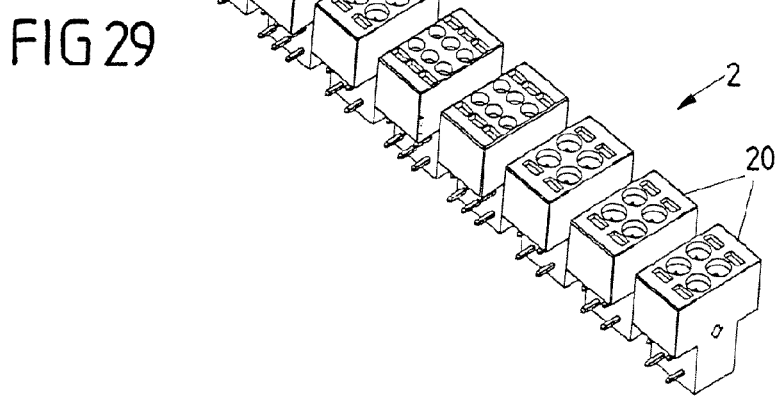
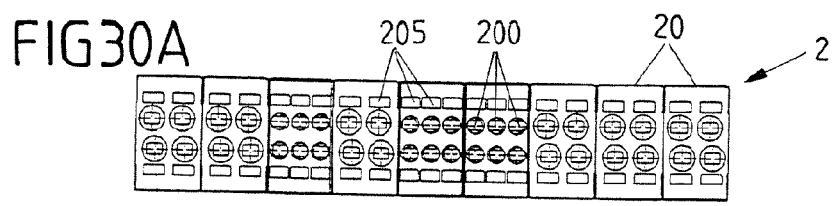
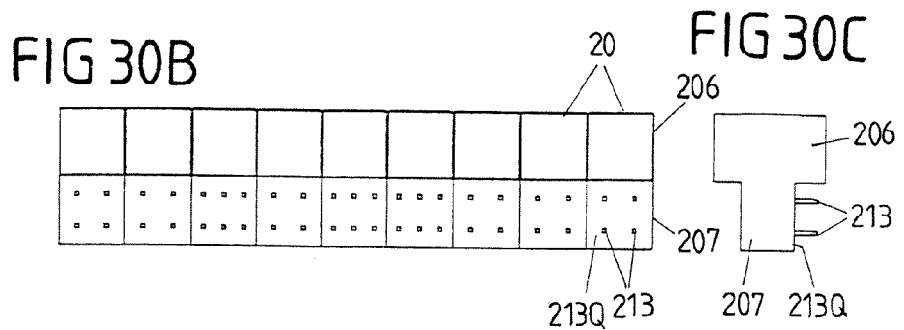

TERMINAL ROW FOR A TERMINAL DEVICE

CROSS REFERENCE TO RELATED APPLICATIONS

This application is a U.S. National Stage Application under 35 U.S.C. §371 of International Application No. PCT/EP2014/072285 filed on Oct. 17, 2014, and claims benefit to German Patent Application No. DE 10 2013 111 867.4 filed on Oct. 28, 2013. The International Application was published in German on May 7, 2015 as WO 2015/062877 A1 under PCT Article 21(2).

FIELD

The invention relates to a terminal row for a terminal device and to a method for producing a terminal row.

BACKGROUND

A terminal row can be attached to an electronics housing in an insertion direction and can be connected to an electronic component, in particular a printed circuit board, that is to be accommodated in the electronics housing. A predetermined number of single electrical conductors or connectors can be connected to the terminal row to produce a connection between the single electrical conductors or connectors and the electronic component.

Terminal rows of this type are conventionally used on modular electronic devices in order to provide a connection technique, for example for sensors and actuators on control electronics or similar. Such electronic devices are used, for example, in industrial facilities such as assembly plants, in combination with what are known as field bus systems and can be clipped onto a support rail in a modular manner in order to be arranged in a compact manner, for example in a workshop. Sensors, which receive sensor signals, and actuators, to which control signals are emitted, are, for example, connected to the terminal row, it also being possible to additionally provide display elements for displaying system states or similar or operating elements for inputting a control command or to regulate state variables.

Due to the complexity and diversity of the requirements for electronic devices, for example for assembly plants, nowadays such electronic devices are developed and produced in a dedicated manner for one specific use. In this case, a specific electronic device contains an electronic component, which has been designed on the basis of the existing requirements, inside a modular electronics housing in the form of a printed circuit board to which a terminal row designed in a specific manner for connecting single electrical conductors or connectors to the electronic component is fixed. Because the requirements for the terminal row are determined in this respect by the electronic component, entirely different terminal rows must be used for different electronic components. This makes the production of such terminal rows complex and diverse and therefore increases the costs thereof.

It has already been conventionally provided for different connection components, for example connectors or terminals, to be provided on a terminal row, and attached to a panel or similar, in order to form the terminal row. Although this makes the production of such terminal rows slightly easier, it still requires the production of specific components, for example dedicated panels, for producing a specific terminal row.

A control device for automatically controlling a technical system is known from DE 10 2011 055 920 83, in which a second modular part is attached to a first modular part. In this case, the first modular part accommodates a printed circuit board while connectors in the form of spring clamp terminals can, for example, be attached to the second modular part. A connecting terminal is known from DE 38 84 329 T2, which allows a plurality of electric cables of different cross sections to be connected. A connecting device is known from DE 10 2008 027 399 A1, in which a plurality of single-pole terminal portions are arranged side by side and bonded to one another.

SUMMARY

In an embodiment, the present invention provides a terminal row for a terminal device, which can be attached to an electronics housing in an insertion direction and which can be connected to an electronic component that is to be accommodated in the electronics housing. The terminal row is configured to have a predetermined number of single electrical conductors or connectors connected thereto to produce a connection between the single electrical conductors or connectors and the electronic component. The terminal row includes a plurality of main housings, at least two of the plurality of main housings being different, wherein the main housings are separate from one another in a pre-assembly state and configured to be attached to one another in a row direction to form the terminal row.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 3 is a view of an electronic device having an electronics housing and a terminal row which is to be attached to the electronics housing and is composed of individual main housings;

FIG. 4 is a view of the arrangement according to FIG. 3, but having only one main housing of the terminal row;

FIG. 10 is a view of connector modules, which are connected to the base strip modules according to FIG. 5-9 to form the terminal row;

FIG. 11 is a view of the connector modules in a state in which they are separate from one another;

FIG. 12 shows the arrangement according to FIG. 10 obliquely from below;

FIG. 13A shows the arrangement according to FIG. 10 from above;

FIG. 13B shows the arrangement according to FIG. 10 from the side;

FIG. 22 is a side view of an electronics housing;

FIG. 23 is a plan view of the electronics housing;

FIG. 24 is a plan view of the electronics housing having base strip modules arranged therein;

FIG. 25 is a plan view onto the electronics housing having connector modules attached to the base strip modules;

FIG. 28 is a view of main housings formed in one piece for forming a terminal row;

FIG. 29 shows the main housings according to FIG. 28 in a state in which they are separate from one another;

FIG. 30A is a plan view of the main housings;

FIG. 30B is a side view of the main housings;

FIG. 30C is an end-face view of the main housings; and

DETAILED DESCRIPTION

Figure 1:
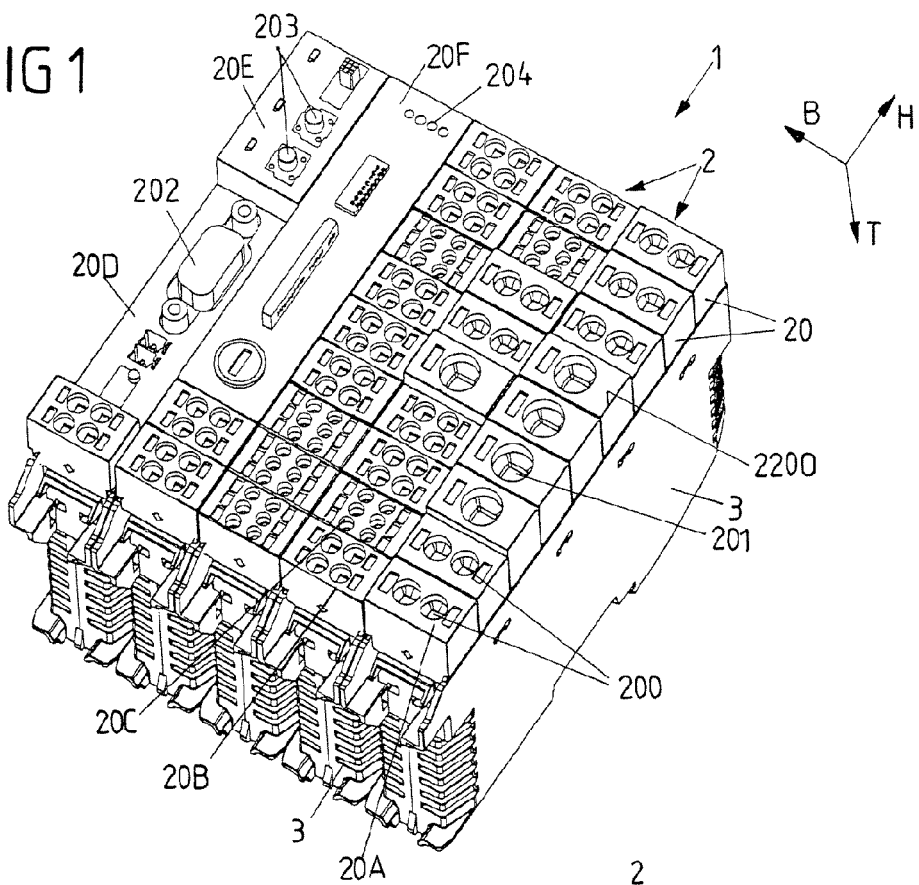
FIG. 1 is a view of various electronic devices to be attached to a common support rail, each having an electronics housing and a terminal row attached to the electronics housing.

An embodiment of the present invention provides a terminal row and a method for producing a terminal row, which allow simple production for use on an electronic device in conjunction with an electronic component without the terminal row having to be completely redesigned for the electronic device having the electronic component arranged therein.

The at least one terminal row according to an embodiment of the invention is composed of a plurality of main housings, of which at least two main housings are different, the main housings being separate from one another in a pre-assembly state and being able to be attached to one another in a row direction to form the terminal row.

According to an embodiment, a terminal row is assembled in the manner of a modular system from a plurality of main housings. Depending on the requirements relating to a terminal row, which are brought about by the electronic component to which the terminal row is to be connected, different main housings can be attached to one another in this case in a modular manner and form the terminal row in an assembled state, which is then connected to the electronic component and can be inserted into an electronics housing.

Since, for producing the terminal row, a selection can be made from various existing modular main housings, which can be attached to one another to form the terminal row, a simple, modular production of the terminal row from existing basic elements emerges, which makes a dedicated design and production of components just for one specific terminal row superfluous.

The main housings, for example, each have a length measured in the row direction, which corresponds to a predetermined pitch measurement or a whole-number multiple of the predetermined pitch measurement. When viewed in the row direction, the terminal row can thus be divided into a predetermined number of horizontal pitches, for example nine horizontal pitches, the length of a horizontal pitch corresponding to the predetermined pitch measurement. In this case, each main housing assumes the length of one or more horizontal pitches. Because the length of each main housing is calculated in the row direction on the basis of a predetermined pitch measurement, it is ensured that a predetermined number of main housings can be attached to one another to form a terminal row having a predetermined overall length, and in this case, the overall length of the terminal row corresponds to a predetermined measurement, which is specified, for example, by the electronics housing and the length of a pre-set attachment opening therein. Different main housings can thus be combined with one another in a simple manner, it being possible to achieve a desired overall length of the terminal row in a simple manner.

The main housings are preferably made from an electrically insulating material, such as a plastic. The main housings are therefore electrically insulating and therefore single electrical conductors or connectors attached to the main housing are electrically separated from one another. The main housing can have an electrically insulating body for this purpose, on or in which, in certain circumstances, electrically conductive components can be arranged for producing conductor paths or contacts. If the main housing acts purely as an insulating element and does not support any contacts then it can be designed so as to insulate overall, therefore not having any electrically conductive components.

The main housings can be designed in principle very differently. In order to allow single electrical conductors or connectors to be connected in this case, at least one contact receptacle for receiving an electrical contact is arranged in at least one main housing of the terminal row. For example, one, two, four, six or eight contact receptacles, each having an electrical contact arranged therein, can be provided on a main housing, the contact receptacles being designed, for example, in the manner of terminals for connecting single electrical conductors. It is, however, also conceivable to provide one contact receptacle, for example, having a plurality of electrical contacts arranged therein, it being possible, for example, to connect an associated connector to the contact receptacle.

In a specific embodiment, preferably a plurality of main housings are provided, which differ in terms of their contact receptacles or in terms of their contacts arranged on the contact receptacles. The main housings can, for example, differ by the number of contact receptacles and/or by the geometric form or dimensions of the contact receptacles.

For example, one, two, four, six or eight contact receptacles can be provided on a main housing for connecting one, two, four, six or eight single electrical conductors, while a different number of contact receptacles is provided on another main housing. Depending, for example, on the size of the cross section of a single electrical conductor, the contact receptacles can have different dimensions in this respect, a comparatively large contact receptacle being provided, for example, to connect a single electrical conductor having a large cross section. The geometric form of the contact receptacle can also be different: for example, a contact receptacle can form a circular opening or even a rectangular, for example square, opening for connecting a single electrical conductor.

Likewise, the main housings can differ by the number of contacts inserted into the contact receptacles, by a distance between two contacts of adjacent contact receptacles, by the arrangement of the contacts in the contact receptacles, by the dimensions of the contacts and/or by the geometric form of the contacts. For example, different numbers of contacts can be arranged on different main housings, the number of contacts not necessarily correlating with the number of contact receptacles. An equal number of contacts, for example two contacts, can also be arranged in each case on different main housings, the distance between the contacts differing between the main housings or the contacts having different dimensions, for example different diameters or a different geometric form (flat contacts, round contacts).

Depending on the requirements for the terminal row, different main housings can be combined with one another in order to form the terminal row, the main housings being kept available in a modular manner and a manufacturer making a selection in a simple manner from the main housings available to them and combining them to form the terminal row.

In order to connect a main housing to the electronic component, for example a printed circuit board, the main housing can have at least one connecting pin, on a transverse wall extending parallel to the row direction and to the insertion direction, for electrically contacting the electronic component. If a plurality of main housings are to be electrically contacted to the electronic component, a plurality of main housings accordingly have such a connecting pin, it being possible to provide one or more connecting pins on each main housing depending on the required number of contacts. For example, if four contacts are provided on four contact receptacles on a main housing, then the main housing preferably also has four connection pins for electrically contacting the electronic component and therefore an electrical connection of, for example, four single conductors can be established with contacts on the electronic component by means of the main housing. In this case, the connecting pins protrude from the transverse wall of the main housing transversely to the row direction and to the insertion direction and therefore the main housing can be attached to the electronic component transversely to the row direction and to the insertion direction. Such a connection pin can also be orientated differently in principle, for example in the insertion direction.

In an assembled state, in which the main housings are attached to one another, the main housings are preferably interconnected by means of the adjacent side walls, for example in an interlocking, force-fitting or integrally bonded and therefore firm manner. For an interlocking connection, adjacent main housings can be latched to one another by means of the adjacent side walls, for example; or, appropriate interlocking elements can be inserted into appropriate guides, for example in the manner of a dovetail guide. For a force-fitting connection, pins, for example, can be pressed into associated openings and therefore a force-fitting connection is established due to the interference fit. An integrally bonded connection can be established by applying a welded joint or by establishing an integral bond by means of acid or the like, for example.

Two main housings can be connected for example using plug-in or snap-on connections and additionally by means of bonding, as is known for example from DE 10 2008 027 399 A1 for terminal portions for forming a multipole terminal (that cannot be attached, however, to an electronics housing). Alternatively the main housings can be interconnected by means of bonding in the manner of the method described in WO 2008/019833 A1.

When the main housings are firmly interconnected in the assembled state by means of the adjacent side walls, a modular terminal row is created which can be attached to the associated electronics component, for example printed a circuit board, as a modular unit and inserted into an electronics system housing. If the main housings each have a length calculated on the basis of a predetermined pitch measurement and if they are each assembled to form a terminal row of a predetermined uniform overall length, the connection of the main housings can be produced for example by means of integral bonding in a standard tool in which, for example, a predetermined number of main housings is inserted and interconnected inside the tool.

In a specific embodiment, at least one connection opening is arranged in the first side wall of a main housing and at least one connection element is arranged on the second side wall in the row direction and protruding from the second side wall. In an assembled state in which the main housings are attached to one another, the at least one connection element of a main housing engages in at least one connection opening of an adjacent other main housing and thus produces an interlocking and/or force-fitting connection between the main housings. Alternatively, the main housings can also have at least one connection opening in each side wall, the two main housings being connected by means of at least one separate connection pin which is to be inserted into the connection openings of two adjacent main housings.

The main housing does not necessarily have to be designed to connect a single electrical conductor or a connector. The main housing can, for example, also form a panel element, an operating element having an adjustable adjusting element arranged thereon or a display element having a display device arranged thereon. A panel element provides a cover with respect to the outside. In this case, a panel element can be used also to provide a larger insulation gap between two contacts. An operating element can, for example, have an adjusting knob for adjusting a potentiometer or a switch or the like to perform an input command. A display element can, for example, have a light emitting diode or a screen element in order to display a system state or output information.

Preferably, the main housings each have the same width, measured in a width direction transverse to the row direction and transverse to the insertion direction. The main housings can therefore be attached to one another in order to provide a terminal row, the width of which is constant in the row direction.

In an assembled state, the main housings are preferably arranged relative to one another such that together they form a flat connection surface to which the single electrical conductors or connectors can be connected. The connection surface is in one plane and thus forms a flush front to the outside and therefore single conductors or connectors can be connected in one plane. In this case, the main housings can, for example, also have the same depth - measured in the insertion direction, it also being conceivable and possible for different main housings to have a different depth. If the main housings have the same depth, the upper surfaces of the main housings (which point the opposite way to the insertion direction) can provide a uniform, flat outer surface. For main housings of different depths, the upper surfaces of individual main housings can be set back or protrude outwards in the insertion direction compared with other main housings.

In an advantageous embodiment, the main housings have the same outer dimensions in each case. The terminal row can thus be composed of main housings, which have the same outer dimensions, i.e. their respective widths, depths and lengths are equal and thus, in terms of their outer dimensions, provide similar modules to form the terminal row. In this case, however, the main housings differ at least partially, for example, by the contact receptacles provided on the main housings or by the number of contacts or also in that one main housing provides a panel element, an operating element or a display element and another main housing provides a connection element for connecting single electrical conductors or a connector.

In a specific embodiment, the main housings can each be formed in one piece. Each main housing therefore provides a standard housing module. In another embodiment, the main housing can also be formed in two pieces. The main housing can, for example, have a base strip module and a plug-in module that can be attached to the base strip module. In this case, the base strip module is to be connected to the electronic component while single electrical conductors or a connector can be connected to the plug-in module.

The plug-in module can be attached to the base strip module in the insertion direction and is mechanically secured to the base strip module in the attached state. For this purpose, one or more contact pins, which engage in one or more associated contact receptacles of the base strip modules in the inserted state, can be arranged on the plug-in module, for example on an underside facing the base strip module. In this case, it is also conceivable in principle that a plurality of plug-in modules can be connected to one base strip module or, vice versa, one plug-in module can be connected to a plurality of base strip modules arranged next to one another.

When configuring the main housing in a two-part form from one base strip module and one plug-in module, the main housings adjacent to the base strip module are preferably interconnected, it being possible, as described above, to produce this connection in turn in an interlocking, force-fitting or integrally bonded manner. It is also conceivable for adjacent plug-in modules to be interconnected additionally or alternatively, it being possible to achieve this connection in turn in an interlocking, force-fitting or integrally bonded manner.

A terminal device preferably has a plurality of terminal rows in the manner described above. Here, the terminal rows are lined up next to one another in a width direction transverse to the row direction and transverse to the insertion direction.

In this case, the terminal rows preferably each have the same width, measured in the width direction. This allows the terminal rows to be used in conjunction with structurally identical electronics system housings, it being possible for each terminal row to be formed from main housings of the same modular form. Here, each terminal row can be assembled in different ways by a different combination of main housings, thus resulting in modular electronic devices having different terminal rows, which are lined up next to one another in the width direction and can be attached to a common support rail.

By each main housing having the same width, the terminal rows preferably each have a constant width, when viewed in the row direction. The width of a terminal row thus does not vary in the longitudinal direction, i.e. in the row direction, but rather is constant. Likewise, the terminal rows can have the same height measured in the insertion direction. This is particularly advantageous if the terminal rows are to provide a uniform, flat outer surface, outwardly on the upper sides of the main housings, to which outer surface single conductors or connectors, for example, can be connected.

The terminal rows can be attached in the insertion direction to a plurality of electronics housings. In this case, electronic components in the form of printed circuit boards are accommodated inside the electronics housings, the terminal rows being attached to the electronics housings in the final assembled state and connected to the electronic components accommodated therein. It is also conceivable and possible in this context for a plurality of terminal rows to be attached to an electronics housing and connected to one or more electronic components arranged inside this electronics housing.

Each electronics housing preferably has a first wall and a second wall opposite the first wall. Here, the second wall is spaced apart from the first wall in the width direction transverse to the insertion direction and transverse to the row direction, and therefore the first wall and the second wall form an insertion opening between them, into which the terminal row is inserted. In this case, the terminal row associated with the electronics housing has an insertion portion on one or more main housings, which is inserted between the walls of the electronics housing and comes to rest between the walls in the inserted state. Here, the width of the insertion opening, measured in the width direction, corresponds substantially to the width of the terminal row at the insertion portions of the main housings, and so the insertion portions are inserted to fit between the walls of the electronics housing. In this case, the terminal row can also have a frame, which, at least in portions, surrounds a plurality of main housings lined up next to one another, it being possible to attach the frame of the terminal row to the electronics housing.

The width of the insertion opening corresponding substantially to the width of the terminal row at the insertion portion is to be understood here to mean that the width of the terminal row (measured at the insertion portion by means of which the terminal row is inserted into the insertion opening) deviates no more than by a tolerance of +/−5%, preferably +/−2% or even +/−1%, from the width of the insertion opening.

The total width of the terminal row—measured at a head of the main housing, which protrudes outwards from the main housing—can preferably correspond to the total width of the electronics housing, i.e. the width of the insertion opening plus the wall thickness of the first and second walls. The lateral external walls of the electronics housing are therefore flush with the terminal row, and so the terminal row and the electronics housing have the same width with respect to the outside.

Furthermore, the electronics housing advantageously has further walls extending transversely to the first wall and to the second wall, which border the insertion opening in the row direction, the insertion opening having a length, measured in the row direction, which corresponds substantially to the length of the terminal row. Owing to the walls of the electronics housing, a box-like receptacle is thus provided in which the electronic component in the form of a printed circuit board is received and into which the terminal row can be inserted. Here, the length of the terminal row corresponds to the length of the insertion opening (measured in the row direction), with a tolerance range of +/−5%, preferably +/−2% or even +/−1%.

The terminal row preferably seals the insertion opening in the state in which it is attached to the electronics housing. The insertion opening thus acts as a receptacle for the terminal row, the insertion opening being sealed with respect to the outside when the terminal row has been attached and thus no further measures, in particular no further cover elements, panels or similar, have to be provided in order to seal the insertion opening with respect to the outside.

In the attached state, the terminal row preferably protrudes outwards out of the electronics housing, and therefore single electrical conductors or connectors can be connected to the terminal row outside of the electronics housing. In this case, the individual main housings of a terminal row can, for example, each have an insertion portion, which is inserted into the insertion opening and comes to rest between the walls of the insertion opening in the inserted state. On each main housing, a head is attached to this insertion portion which protrudes outwards from the electronics housing and thus is arranged outside of the electronics housing. Contact receptacles having contacts arranged thereon, to which the single electrical conductors or connectors can be connected, are preferably arranged on this head.

An electronic device preferably has an electronics housing in which an electronic component is arranged. The terminal row is connected to the electronic component and attached to the electronics housing, and therefore single electrical conductors or connectors can be connected to the electronic device by means of the terminal row. The electronic device and its electronic component can, for example, act as a control unit in a field bus system for controlling systems, it being possible, for example, for sensor signals to be received by connected sensors as input and control commands to be output from connected actuators as output.

The electronic component is preferably formed by a printed circuit board, which is accommodated in the electronics housing. In the state in which it has been inserted into the electronics housing, the printed circuit board preferably extends flat along a plane spanning the row direction and the insertion direction, the terminal row being contacted to the printed circuit board and retained on the printed circuit board in a contacting manner.

For this purpose, the printed circuit board can, for example, have contact openings into which contact pins of the terminal row can be inserted in the width direction transverse to the row direction and transverse to the insertion direction. The contact pins protrude from transverse walls of the main housings in the width direction and can be brought into engagement with the associated contact openings of the printed circuit board, and therefore in the connected state (for example after additional soldering of the contact pins to the printed circuit board) the terminal row is fixed to the printed circuit board in an electrically contacting manner.

An assembly kit of one or more terminal rows comprises a plurality of main housings, which are separate from one another and can be attached to one another to form one or more terminal rows. Such an assembly kit can, for example, consist exclusively of main housings that can be interconnected. It is, however, also conceivable for one or more electronics housings, which are supplied together with the main housings, to be also included in such an assembly kit. Such an assembly kit, which can, for example, be supplied to a manufacturer at an industrial plant, such as an assembly plant or the like, allows a modular assembly of terminal rows having main housings in different combinations, and so different terminal rows for connecting to different electronic components can be provided from one standard assembly kit.

According to an embodiment, a method is provided for producing a terminal row for a connecting device, which can be attached to an electronics housing in an insertion direction and can be connected to an electronic component to be accommodated inside the electronics housing, it being possible to connect a predetermined number of single electrical conductors or connectors to the terminal row to produce a connection between the single electrical conductors or connectors and the electronic component. In this case, it is provided for at least one terminal row to be assembled from a plurality of main housings, of which at least two main housings are different from one another, the main housings being separate from one another in a pre-assembly state and being attached to one another in a row direction to form the terminal row.

With respect to advantages and advantageous embodiments, reference can be made to what has been described above, which applies in the same way to a method according to an embodiment of the invention. To produce a terminal device, the terminal rows can, for example, be lined up next to one another in a width direction transverse to the row direction and transverse to the insertion direction. One or more terminal rows or a terminal device of the kind described above can advantageously be used on an electronics housing.

Figure 2:
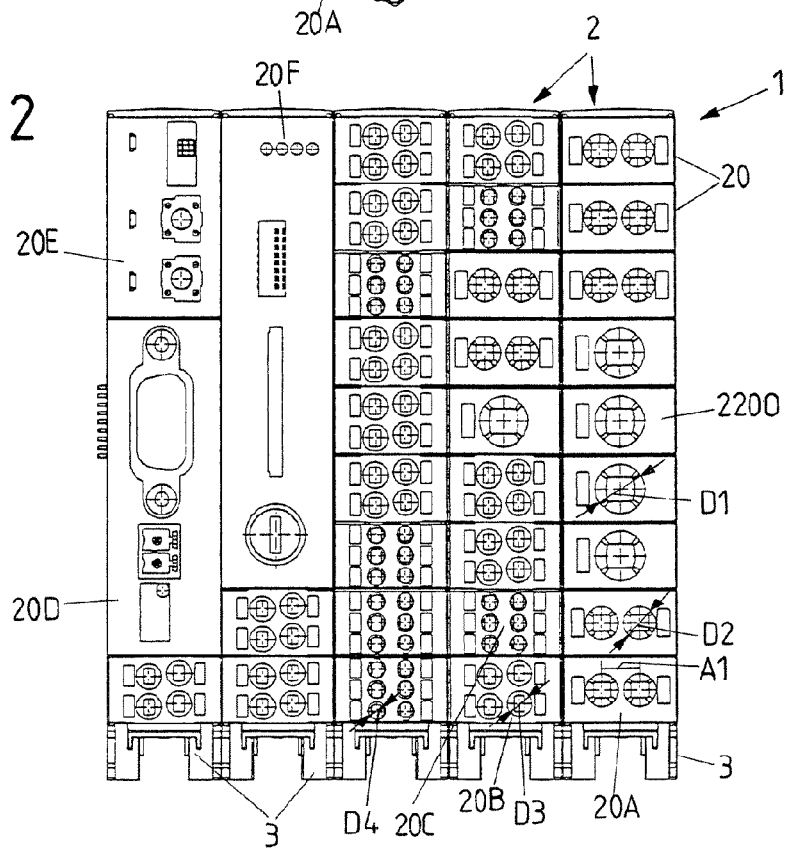
FIG. 2 shows the arrangement according to FIG. 1 from above.
Figure 5:
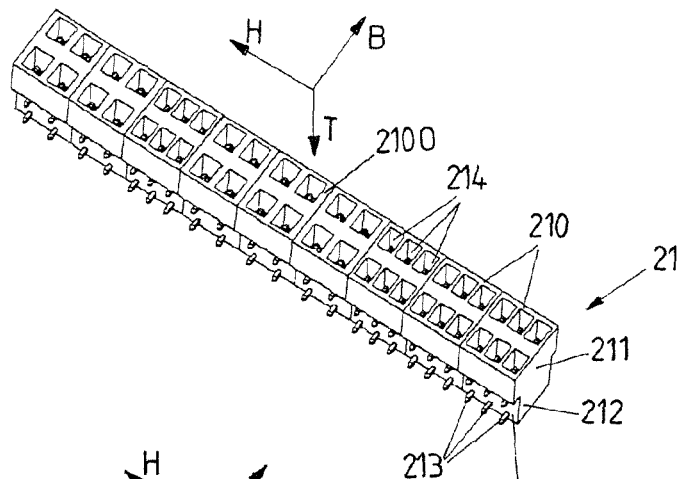
FIG. 5 is a view of base strip modules of the terminal row in a state in which they are attached to one another.
Figure 6:
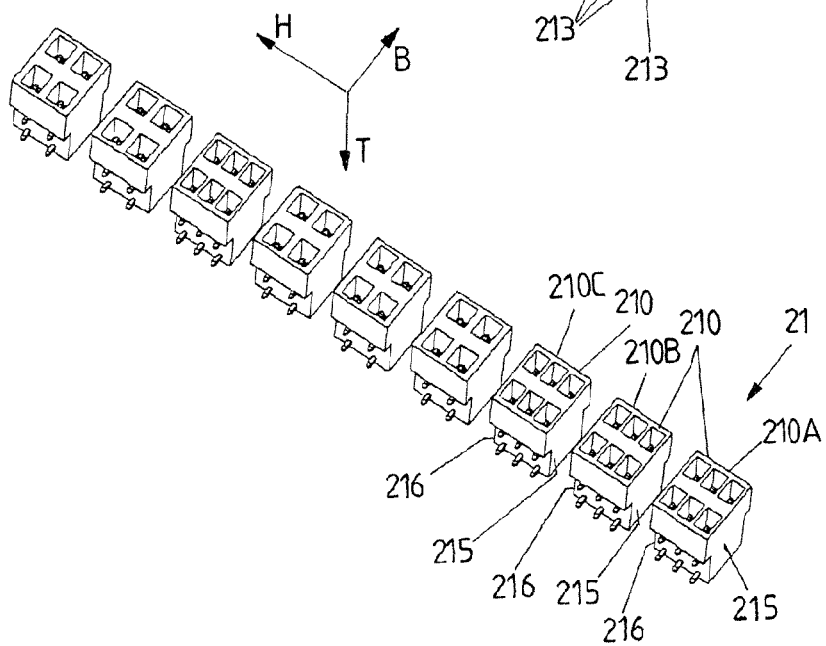
FIG. 6 shows the base strip modules according to FIG. 5 in a state in which they are separate from one another.

FIGS. 1 and 2 show a terminal device 1, which is formed in a modular manner by one electronics housing 3 and one terminal 2 in each case, and an electronic component in the form of a printed circuit board accommodated in the electronics housing 3. The electronics housings 3 of the electronic devices are lined up next to one another in a width direction B and can be attached to a common support rail in a known manner, and therefore a compact electronic device having modular, individual electronic devices is provided.

The terminal rows 2 of each electronics housing 3 extend longitudinally in a row direction H to the associated electronics housings 3. In this case, the terminal rows 2 are arranged in a depth direction T above the electronics housings 3 and protrude outwards from the electronics housings 3 in the depth direction T.

The terminal rows 2 create an interface for connecting single electrical conductors or connectors to the electronic components accommodated in the electronics housings 3. For this purpose, the terminal rows 2 have a large number of contact receptacles 200 in which contacts 201 are arranged and which form dampers, for example, for connecting single electrical conductors. Moreover, plug connector parts 202, adjusting elements 203 or display elements 204 are provided on the individual terminal rows 2. A compatible connector can be connected to a plug connector part 202. An adjustment, for example to adjust a potentiometer, can be carried out using adjusting elements 203, and a system state can be displayed, for example, using display elements 204.

The configuration of the individual terminal rows 2 depends on the electronic components accommodated in the electronics housings 3. Depending on what function the electronic components accommodated in the electronics housings 3 fulfil, different conductors or connectors of different external modular units can be connected to the connecting parts 2.

For example, such terminal devices 1 can be used in industrial plants in which, for example, sensors and actuators are to be connected to higher-level control devices. The control devices are formed by the electronic components accommodated in the electronics housings 3 and receive sensor signals from sensors, which are connected by means of the terminal rows 2 and emit control signals to actuators, which are likewise connected by means of the terminal rows 2.

In the context of the present invention, in the case of the terminal device 1, the terminal rows 2 are each assembled from different main housings 20, 20A-20F. In this case, the main housings 20, 20A-20F are lined up next to one another in a row direction H to form a terminal row 2 and have different numbers of contact receptacles 200, for example, and contacts 201 arranged thereon. Here, the main housings 20, 20A-20F can vary in the number of contact receptacles, the size of the contact receptacles, the form of the contact receptacles, the number of contacts arranged in the contact receptacles, the size or form of the contacts, the arrangement of the contacts or the like. Moreover, a main housing 20, 20A-20F can also carry out a different function from that of connecting single electrical conductors or connectors and, for example, act as an operating element or display element.

In the case of the specific embodiment shown in FIGS. 1 and 2, the main housing 20A has two contact receptacles 200, for example, which can be designed to connect two single electrical conductors in the manner of dampers, for example spring terminals. The main housing 20B in contrast has four contact receptacles 200, which have smaller diameters than the two contact receptacles 200 of the main housing 20A. The main housing 20C in turn has six contact receptacles 200, which have smaller diameters than the contact receptacles 200 of the main housing 20B and of the main housing 20A. Another main housing 20D has a connector part 202 in the manner of a D-sub connector. Yet another main housing 20E forms an operating element having two adjusting elements 203 arranged thereon in the manner of rotary controls, and a main housing 20F forms a display element having a display device arranged thereon in the form of light emitting diodes.

As can be seen from FIGS. 1 and 2, different contact receptacles 200 and contacts 201 of different main housings 20, 20A-20C can be designed differently. For example, the contact receptacles 200 can have different diameters D1-D4, or contacts 201 of different main housings 20, 20A-20C can have different spacings A1 from one another. In this case, contact receptacles 200 having a large diameter can be designed to receive single conductors having a large diameter and accordingly a high current load capacity while small contact receptacles 200 can receive conductors having small diameters and accordingly low current load capacity.

FIGS. 3 and 4 show an electronics housing 3 having an electronic component 4 arranged thereon in the form of a printed circuit board, which has contact openings 40 for connecting main housings 20 of the associated terminal row 2. The main housings 20 in this case are each formed in two parts from two housing elements, namely a base strip module 210 and a connector module 220 that is to be attached thereto. Here, the connector modules form contact receptacles 200 on an upper side 220O for connecting single electrical conductors 4, while the electrical contact with the electronic component 4 is produced by means of the base strip modules 210.

For the assembly, first a base strip 21 is assembled from a combination of base strip modules 210 and connected to the electronic component 4 in the form of the printed circuit board via the contact openings 40. The base strip 21 can then be inserted together with the electronic component 4 in an insertion direction E, corresponding to the depth direction T, into an insertion opening 30 in the electronics housing 3, so that the electronic component 4 and the base strip 21 formed by the base strip modules 210 come to rest in the interior of the electronics housing 3. Associated connector modules 220 can then be inserted on the individual base strip modules 210 in an insertion direction E, and therefore the electronic device is completed in the inserted state and—in this embodiment—single electrical conductors 5 can be connected to the terminal row 2.

The base strip 21 formed by the base strip modules 210 is shown in separate views in FIGS. 5 to 7A, 7B. The base strip 21 is formed in a modular manner—in this example—by nine individual base strip modules 210, which are attached to one another in the row direction H and can be connected to the electronic component 4. For this purpose, contact pins 213 protruding from a transverse wall 213Q are provided on each base strip module 210, which extend in the width direction B and can be brought into plug engagement with the contact openings 40 in the electronic component 4.

On an upper side 210O, the base strip modules 210 have contact receptacles 214 having contacts 217 arranged therein (see FIG. 7B), which are designed to produce an electrical contact with the connector modules 220 to be attached to the base strip modules 210.

The base strip modules 210 each have a head 211 and a base 212. The contact receptacles 214 are arranged on the head 211 while the base 212 carries the contact pins 213 on the transverse wall 213Q. Measured in the width direction B, the base 212 has a smaller width than the head 211.

Each base strip module 210, 210A-210C has two side walls 215, 216, which extend transversely to the row direction H and border the base strip module 210, 210A-210C laterally. Adjacent base strip modules 210, 210A-210C are attached to one another by means of the side walls 215, 216, it also being possible to interconnect the base strip modules 210, 210A-210C firmly by means of their side walls 215, 216.

Figure 8:
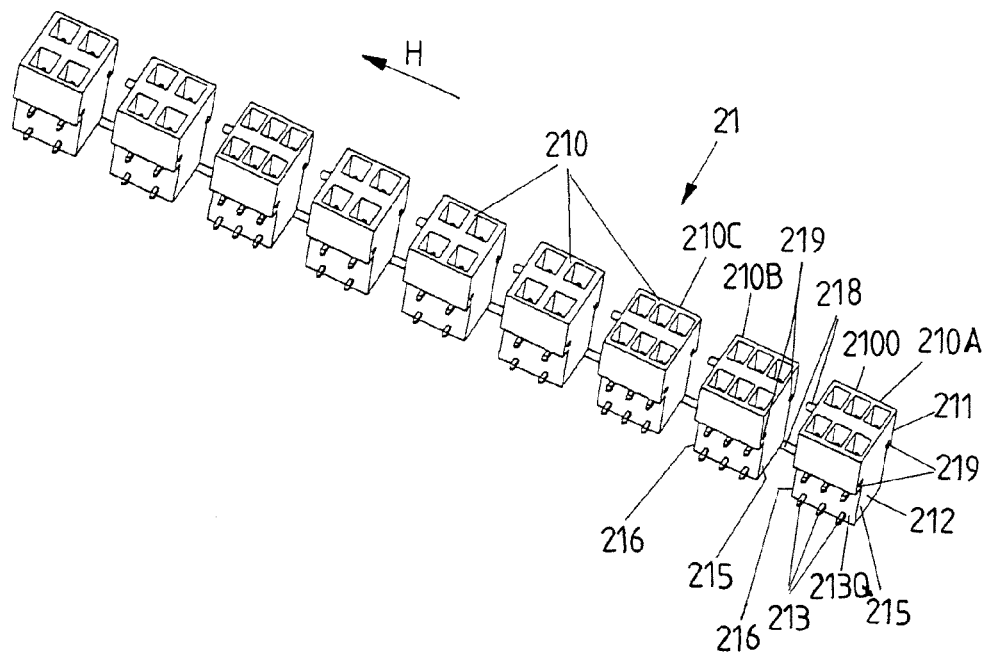
FIG. 8 is a modified embodiment of base strip modules, which are interconnected.
Figure 9:
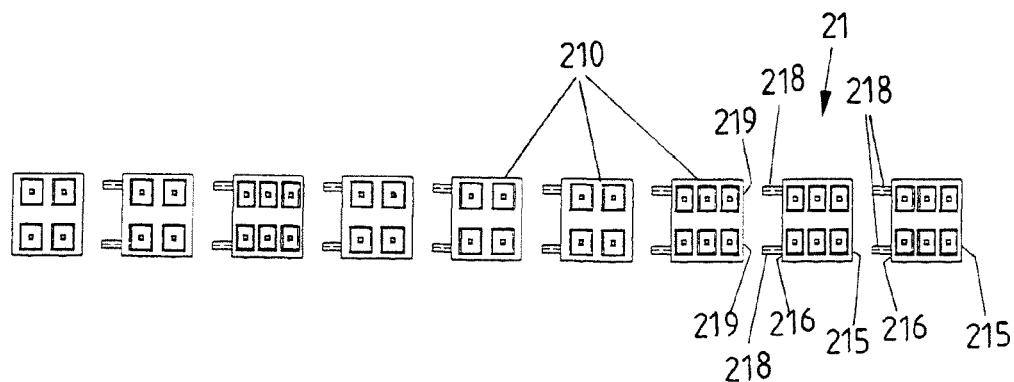
FIG. 9 shows the arrangement according to FIG. 8 from above.

This is shown in an embodiment by FIGS. 8 and 9. For example, in a first side wall 215 of a base strip module 210, 210A-210C, connection openings 219 can be provided which can be brought into engagement with associated connecting pins 218 on a second side wall 216 of an adjacent base strip module 210, 210A-210C. Here, the base strip modules 210, 210A-210C can be attached to one another in a plugging manner in the row direction H, resulting in a firmly connected, uniform base strip 21.

In the embodiment according to FIGS. 8 and 9, two connecting pins 218 are arranged on the second side wall 216 and can be brought into engagement with two associated connection openings 219 in the first side wall 215 of the adjacent base strip modules 210, 210A-210C. In principle, however, more connecting pins 218 and more connection openings 219 can also be provided.

Moreover, the connection can also be produced in an entirely different way. Generally, the base strip modules 210, 210A-210C can be interconnected in an interlocking, force-fitting or integrally bonded manner, entirely different types of connection being conceivable and possible to produce an interlocking, force-fitting or integrally bonded connection. An interlocking connection can, for example, also be produced by means of a dovetail guide, in which a dovetail interlocking element can be inserted into an associated guide. A force-fitting connection can, for example, be produced by means of a press fit, for example using connecting pins 218 and connection openings 219, as shown in FIGS. 8 and 9, and an integrally bonded connection can, for example, be achieved by welding or using acid or the like to produce an integral bond.

Connector modules 220, which form a connector strip 22, are attached to the base strip modules 210 of the base strip 21. This is shown in FIGS. 10 to 16. In this case, each connector module 220 has contact pins 222 on an underside 220U facing an associated base strip module 210, which pins can be brought into plug engagement with the contact receptacles 214 on the base strip modules 210 in the insertion direction E. The contact pins 222 protrude from the underside 220U towards the base strip module 210 and each carry one contact, which can be brought into a contacting connection with the contact 217 of the associated contact receptacle 214 of the base strip module 210.

In the embodiment shown, the number of contact receptacles 200 of a connector module 220 correlates to the number of contact pins 222 of the connector module 220, and the number of contact pins 222 of the connector module 220 correlates in turn with the number of contact receptacles 214 of the associated base strip module 210 and the number of contact pins 213 arranged on the transverse wall 213Q. The connector module 220A has, for example, four contact receptacles 200 while the adjacent connector module 220B forms six contact receptacles. The associated base strip modules 210 have a corresponding number of contact receptacles 214 and contact pins 213. Single electrical conductors can therefore be connected to the electronic component 4 in the form of the printed circuit board by means of the contact receptacles 220 provided on the connector modules 220 in the manner of spring terminals, screw terminals or similar.

A tool engagement point 205 is assigned to each contact receptacle 200 of a connector module 220, by means of which tool engagement point a single electrical conductor can be connected to the contact receptacle 200 or released from the contact receptacle 200.

To complete the terminal row 2, the connector modules 220 are attached to the base strip modules 210 which have already been inserted into the electronics housing 3 together with the electronic component 4. In this case, the connector modules 220 are inserted in the insertion direction E, the connector modules 220 being attached, for example, individually to the associated base strip modules 210 and coming to rest in the attached state with side walls 223, 224 against one another (see FIG. 11). In this case, it is also conceivable and possible to interconnect the connector modules 220 initially by means of their side walls 223, 224 to form a uniform connector strip 22, and therefore a uniform connector strip 22 is produced which can be attached to the associated base strip 21.

Figure 7A:
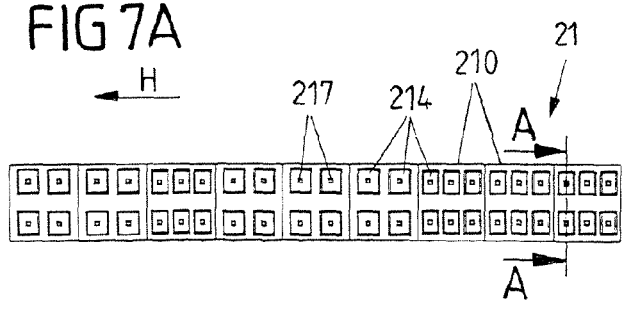
FIG. 7A shows the arrangement according to FIG. 5 from above.
Figure 7B:
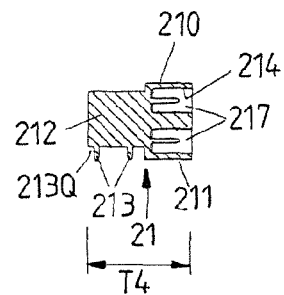
FIG. 7B is a sectional view along the line A-A according to FIG. 7A.

In the embodiment shown, the base strip modules 210 each have a uniform length H1, measured in the row direction H, as marked in FIG. 7A. The base strip modules 210 are thus the same length in the row direction H. Moreover, in the embodiment shown, the base strips also have a uniform depth T4, marked in FIG. 7B.

The same applies to the connector modules 220, which have a uniform length H1 in the row direction H (see FIG. 13A) that corresponds to the length H1 of the base strip modules 210. Moreover, the connector modules 220 also have a uniform depth T1.

Figure 14:
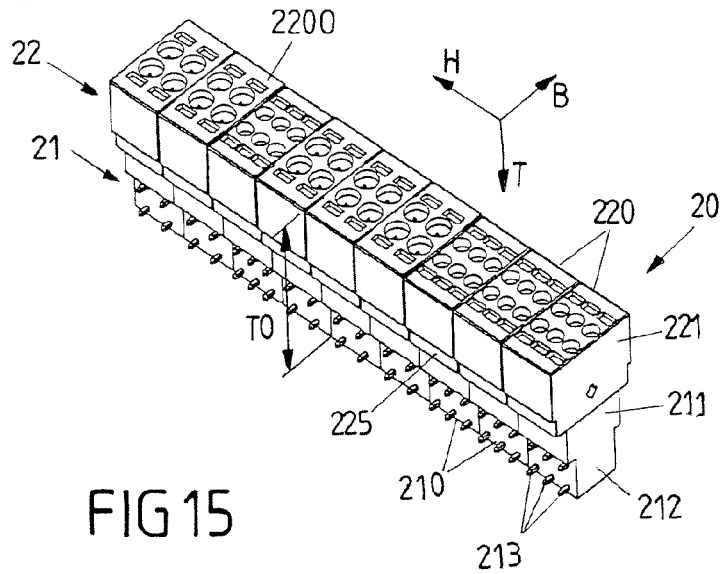
FIG. 14 shows the connector modules according to FIG. 10-13 and the base strip modules according to FIG. 5-9 in a state in which they are attached to one another.
Figure 15:
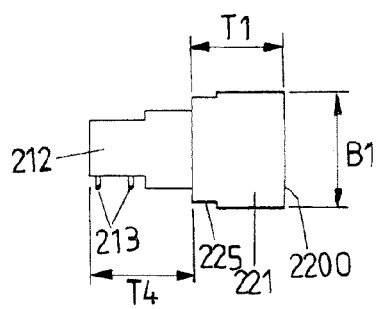
FIG. 15 shows the arrangement according to FIG. 14 from the side.
Figure 16:
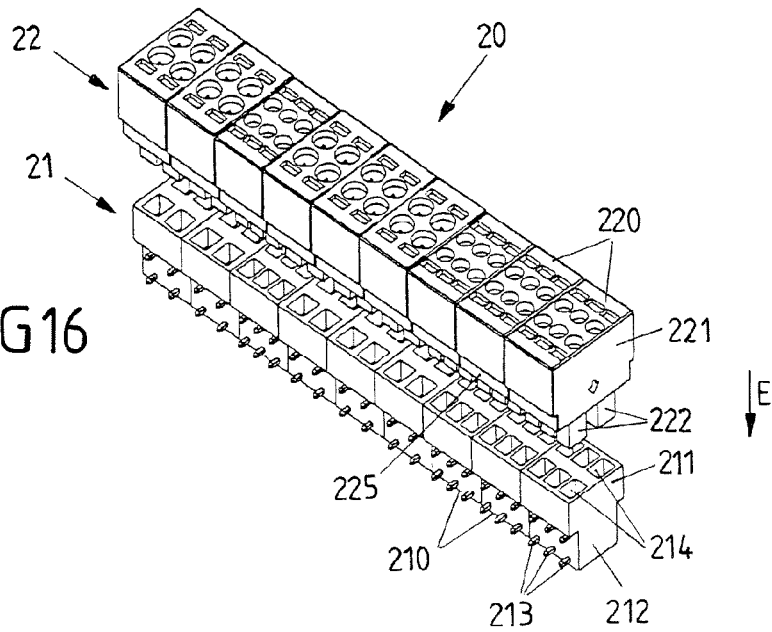
FIG. 16 shows the connector modules and the base strip modules in a state in which they are separate from one another.
Figure 17:
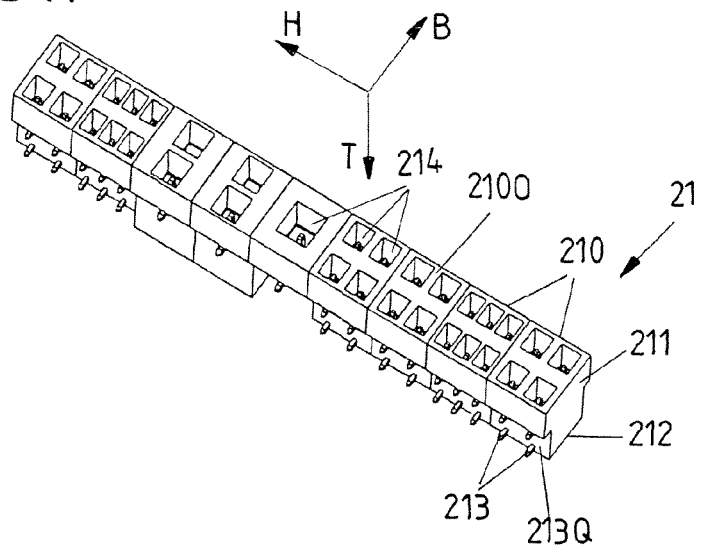
FIG. 17 is a view of another embodiment of base strip modules.
Figure 18:
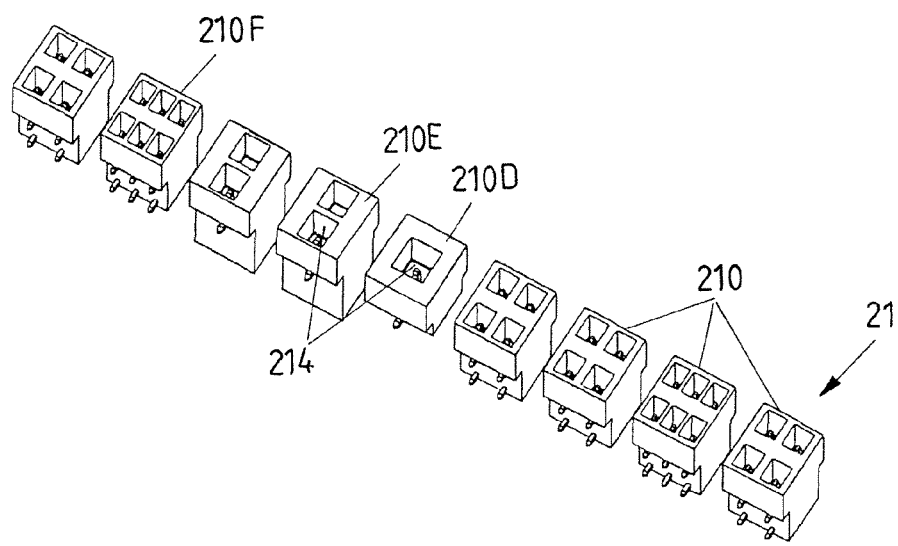
FIG. 18 shows the base strip modules according to FIG. 17, in a state in which they are separate from one another.
Figure 19A:
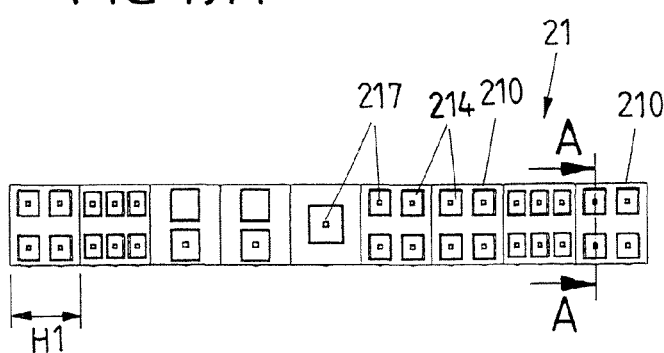
FIG. 19A shows the arrangement according to FIG. 17 from above.
Figure 19B:
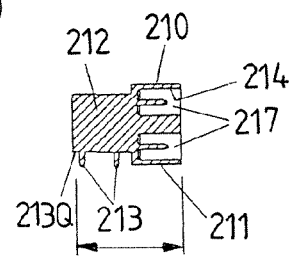
FIG. 19B is a sectional view along the line A-A according to FIG. 19A.

A terminal row 2 results, which—as shown in FIGS. 14 to 16—viewed in the row direction H, has a constant depth T0, made up of the depths T1, T4 of the connector modules 220 and of the base strip modules 210. The upper sides 220O of the connector modules 220 therefore form a uniform, flat surface by means of which the single electrical conductors can be connected to the terminal row 2.

In this embodiment, both the connector modules 220 and the base strip modules 210 are designed to have identical outer dimensions in each case and therefore have the same length, depth and width. Here, the external width of the terminal row 2 is determined by the width B1 at heads 221 of the connector modules 220. Because the width B1 is the same for each connector module 220, the width B1 of the terminal row 2 is constant in the row direction H.

Figure 20:
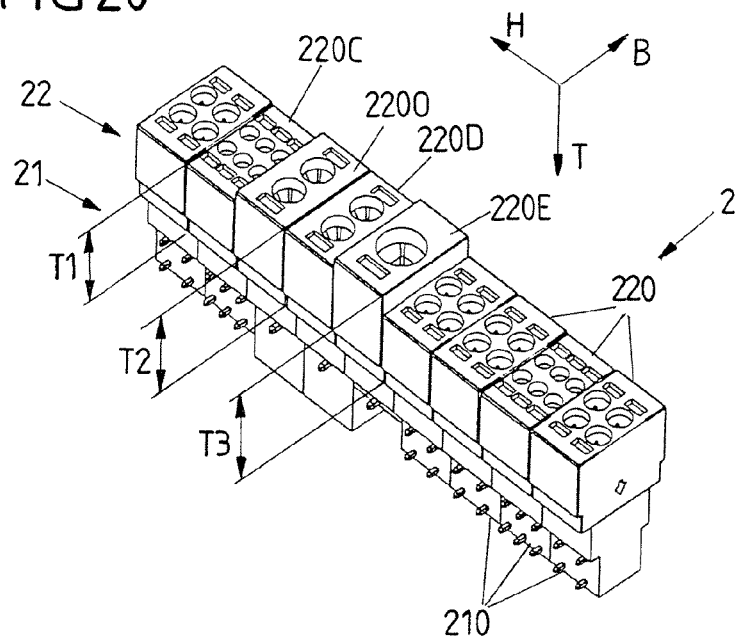
FIG. 20 shows the base strip modules according to FIG. 17 having connector modules attached thereto.
Figure 21:
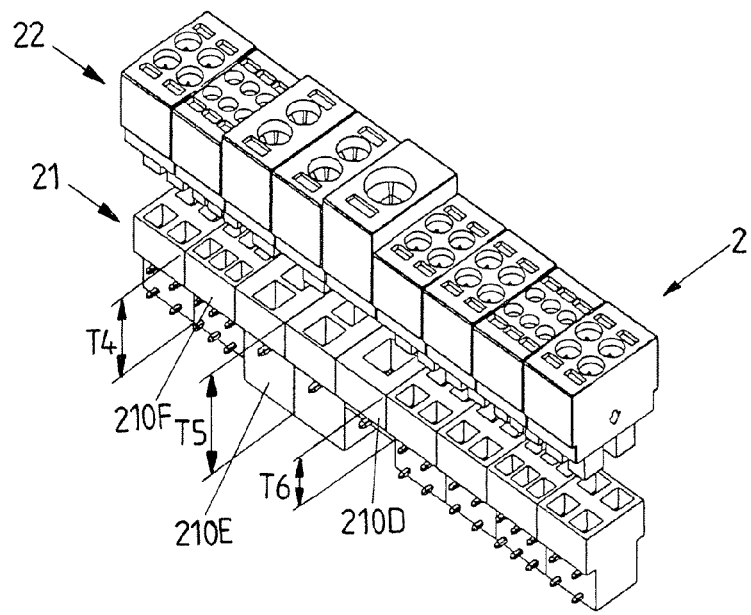
FIG. 21 shows the arrangement according to FIG. 20 having connector modules separate from the base strip modules.

In the case of the embodiments just described, the depth T0 of the terminal row 2 in the row direction H is constant. In contrast to this, in the embodiment according to FIGS. 17 to 21, the depth of the terminal row 2 in the row direction H is not constant, but rather varies along the terminal row 2, caused by both the connector modules 220 of the connector strip 22 and the base strip modules 210 of the base strip 21 having different depths T1-T6. This leads to the upper sides 220O of different connector modules 220C, 220D, 220E being offset from one another, as can be seen from FIGS. 20 and 21, and thus when the terminal row 2 is attached to the electronics housing 3, no level, flat surface facing outwards is produced. Moreover, also the base strip modules 210D, 210E, 210F extend to different depths into the electronics housing 3, caused by the base strip modules 210D, 210E, 210F having different depths T4, T5, T6.

FIGS. 22 to 27 illustrate the proportions of the electronics housing 3 and of the terminal row 2 attached to the electronics housing 3. As can be seen from FIGS. 22 and 23, the electronics housing 3 has a substantially box-like shape having side walls 32, 34 and end-face walls 31, 33, which between them form a receiving opening 30 to receive the electronic component 4 and for inserting the terminal row 2. Here, the side walls 32, 34 are spaced apart from one another in the width direction B, while the end-face walls 31, 33 are opposite one another in the row direction H. The electronic component 4 and the terminal row 2 can be inserted into the insertion opening 30 in the insertion direction E.

Figure 26:
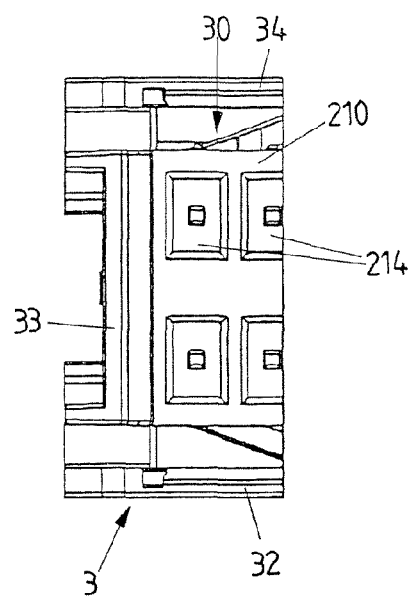
FIG. 26 is an enlarged view in the section C according to FIG. 24.

In this case, the base strip 21 formed by the base strip modules 210 comes to rest in the interior of the electronics housing 3 in the inserted state, the length L of the insertion opening measured between the end-face walls 31, 33 being corresponding substantially to the length of the base strip 21, as can be seen in FIG. 24. In the inserted state, the end base strip module 210 lies substantially flush to the adjacent end-face wall 33, as can be seen in FIG. 26.

When the connector strip 22 formed by the connector modules 220 is attached, the insertion opening 30 is sealed, insertion portions 225 formed on the heads 221 of the connector modules 220 being inserted so as to be flush between the side walls 32, 34 of the electronics housing 3. In this case, the width B2 of the insertion opening 30 in the width direction B corresponds substantially to the width of the insertion portions 225 of the connector modules 220, as can be seen from FIG. 27.

Figure 27:
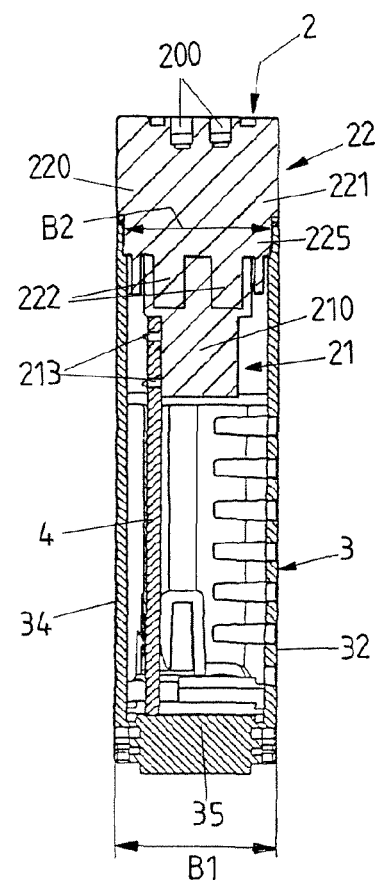
FIG. 27 is a sectional view along the line B-B according to FIG. 25.

At the same time, the outer width B1 of the connector strip 2 corresponds to the outer width of the electronics housing 3, as can also be seen from FIG. 27. The outer width of the electronics housing 3, which is measured by the inner width B2 of the insertion opening 30 plus the wall thickness of the side walls 32, 34, corresponds to the width B1 at the heads 221 of the connector modules 220.

In the completed state, the heads 221 of the connector modules 220 of the connector strip 22 protrude from the electronics housing 3, and therefore single electrical conductors can be connected to the terminal row 2 by means of the heads 221. When the connector strip 22 is attached to the base strip 21, the insertion opening 30 is also sealed to the outside, and so the electronics housing 3 is closed. This is achieved by the terminal row 2, without additional cover elements being required for sealing the electronics housing 3.

Figure 31:
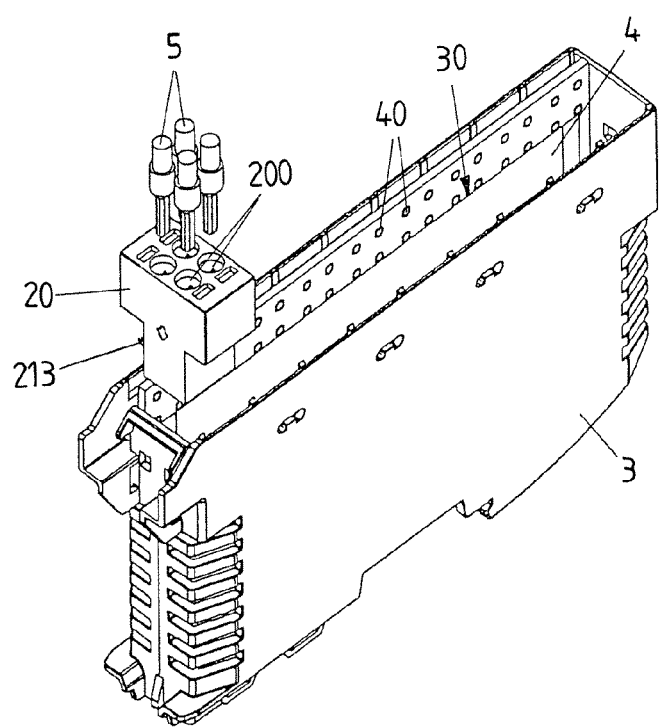
FIG. 31 is a view of an electronics housing having a main housing arranged thereon according to the embodiment according to FIG. 28-30A and 30C.

FIGS. 28 to 31 show another embodiment of a terminal row 2, which is produced from main housings 20 having just one housing part. In this case, the main housings 20 form what are known as PCB terminal blocks, for which contact receptacles 200 having contacts 201 arranged therein are arranged on a head 206 and contact pins 213 are arranged on a base 207 for connecting it to the electronic component 4. Instead of the two-part configuration having separate base strip modules and connector modules, a one-part main housing 20 is therefore used, which can be connected to the associated electronic component 4, as shown in FIG. 31.

Apart from this, the terminal row 2 formed by the main housings 20 is substantially functionally identical to that which is described above and can be attached in particular at an insertion opening 30 in a main housing 3 in order to substantially seal the insertion opening 30 in the attached state.

The invention is not limited to the embodiments described above, but rather can be achieved in entirely different ways in other embodiments. In particular, main housings of the type described here can constitute entirely different elements of an electronic device, for example terminals, display elements or operating elements. In this respect, a main housing does not necessarily have contact receptacles or plug connector parts for connecting single electrical conductors or connectors.

Moreover, the main housings do not necessarily have to have the same length in the row direction, but rather can also have, for example, a length corresponding to a whole-number multiple of a predetermined pitch measurement. Therefore, a first main housing can have, for example, a first length and a second main housing can have, for example, a second length, which is double or three times the first length, it being possible for other main housings in turn to have other lengths.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

1 Terminal device
2 Terminal row
20, 20A-20F Main housing
200 Contact receptacle
201 Contact
202 Plug connector part
203 Adjustment element
204 Display element
205 Tool engagement point
206 Head
207 Base
21 Base strip
210, 210A-210F Base strip module
210O Upper side
211 Head
212 Base
213 Contact pins
213Q Transverse side
214 Contact receptacles
215, 216 Side wall
217 Contacts
218 Connecting elements
219 Connection openings
22 Connector strip
220, 220A-220E Connector module
220O Upper side
220U Underside
221 Head
222 Contact pins
223, 224 Side wall
225 Insertion portion
3 Electronics housing
30 Insertion opening
31-34 Side wall
35 Base wall
4 Electronic component (printed circuit board)
40 Contact openings
5 Single conductor
A1 Spacing
B Width direction
B1 Width
B2 Opening width
D1-D4 Dimension
E Insertion direction
H Row direction
H1 Length
L Length
T Depth direction
T0-T6 Depth

The invention claimed is:

1. A terminal row for a terminal device, which can be attached to an electronics housing in an insertion direction and which can be connected to an electronic component that is to be accommodated in the electronics housing,
   the terminal row being configured to have a predetermined number of single electrical conductors or connectors connected thereto to produce a connection between the single electrical conductors or connectors and the electronic component, the terminal row comprising:
   a plurality of main housings, at least two of the plurality of main housings being different,
   wherein the main housings are separate from one another in a pre-assembly state and configured to be attached to one another in a row direction to form the terminal row, and
   wherein the main housings each comprise a base strip module and a connector module that can be attached to the base strip module.

2. The terminal row according to claim 1, wherein the main housings each have a length, measured in a row direction, which corresponds to a predetermined pitch measurement or to a whole-number multiple of the predetermined pitch measurement.

3. The terminal row according to claim 1, Wherein the main housings are produced from an electrically insulating material.

4. The terminal according to claim 1, wherein at least one contact receptacle for receiving an electrical contact is arranged on at least one main housing.

5. The terminal row according to claim 1, wherein one or more contact receptacles are arranged in each case on at least two main housings to receive one or more electrical contacts, the at least two main housings differing by at least one of the group consisting of:
   a number of contact receptacles,
   a geometric form and/or a dimension of contact receptacles
   electrical contacts arranged in the contact receptacles,
   a number of contacts inserted into the contact receptacles,
   a spacing between two contacts of adjacent contact receptacles,
   an arrangement of the contacts in the contact receptacles,
   a dimension of the contacts, and
   a geometric form of the contacts.

6. The terminal row according to claim 1, wherein at least one main housing forms a panel element, and
   Wherein an operating element having an adjusting element is arranged thereon or a display element having a display device is arranged thereon.

7. The terminal row according to claim 1, wherein the main housings have the same width, measured in a width direction transverse to the row direction and transverse to the insertion direction.

8. The terminal row according to claim 1, wherein, in an assembled state in which the main housings are attached to one another, the main housings form a flat connection. surface to which the single electrical conductors or connectors can be attached.

9. The terminal row according to claim 1, wherein the main housings have the same outer dimensions.

10. The terminal row according to claim 1, wherein each base strip module can be connected to the electronic component, and. a predetermined number of single electrical conductors or connectors can be connected to the connector module.

11. The terminal row according to claim 1, wherein base strip modules of adjacent main housings are interconnected.

12. The terminal row according to claim 1. wherein the main housings each comprise a first side wall extending transversely to the row direction and a second side wall parallel to the first side wall, adjacent main housings being attached to one another such that the first side wall of a main housing abuts the second side wall of an adjacent main housing.

13. The terminal row according to claim 12, wherein, in an assembled state in which the main housings are attached to one another, adjacent main housings are interconnected in an interlocking, force-fitting or integrally bonded manner by means of the side walls that abut each other.

14. A terminal device comprising a plurality of terminal rows, each terminal row capable of being attached to an electronics housing in an insertion direction and which can be connected to an electronic component that is to be accommodated in the electronics housing, each terminal row being configured to have a predetermined number of single electrical conductors or connectors connected thereto to produce a connection between the single electrical conductors or connectors and the electronic component, each terminal row comprising:
   a plurality of main housings, at least two of the plurality of main housings being different, wherein the main housings are separate from one another in a pre-assembly state and configured to be attached to one another in a row direction to form the terminal row,
   Wherein the plurality of terminal rows are arranged next to one another in a width direction transverse to the row direction and transverse to the insertion direction, and
   wherein the main housings each comprise a base strip module and a connector module that can he attached to the base strip module.

15. The terminal device according to claim 14, wherein the terminal rows have a same width, measured in the width direction, and/or have a same height, measured in the insertion direction.

16. An electronics housing having a terminal row capable of being attached to an electronics housing in an insertion direction and which can be connected to an electronic component that is to be accommodated in the electronics housing, the terminal row being configured to have a predetermined number of single electrical conductors or connectors connected thereto to produce a connection between the single electrical conductors or connectors and the electronic component, the terminal row comprising:
   a plurality of main housings, at least two of the plurality of main housings being different, wherein the main housings are separate from one another in a pre-assembly state and configured to be attached to one another in a row direction to form the terminal row,
   Wherein the terminal row is attached to the electronics housing in the insertion direction, and
   wherein the main housings each comprise a base strip module and a connector module that can be attached to the base strip module.

17. The electronic device having an electronics housing according to claim 16, wherein an electronic component is arranged inside the electronics housing and the terminal row is connected to the electronic component.

18. The electronics housing according to claim 16, wherein the electronics housing comprises a first wall and a second wall opposite the first wall, which are spaced apart from each other in the width direction transverse to the insertion direction and transverse to the row direction and between them form an insertion opening into which an insertion portion of the terminal row is inserted.

19. The electronics housing according to claim 18, wherein the width of the insertion opening, measured in the width direction, corresponds substantially to the width of the terminal row at the insertion portion.

20. The electronics housing according to claim 18, wherein the electronics housing comprises walls which extend transversely to the first wall and to the second wall and border the insertion opening in the row direction, the insertion opening, measured in the row direction, having a length which corresponds substantially to the length of the terminal row.

21. An assembly kit of one or more terminal rows, each terminal row capable of being attached to an electronics housing in an insertion direction and which can be connected to an electronic component that is to he accommodated in the electronics housing, each terminal row being configured to have a predetermined number of single electrical conductors or connectors connected thereto to produce a connection between the single electrical conductors or connectors and the electronic component, each terminal row comprising:
- a plurality of main housings, at least two of the plurality of main housings being different, wherein the main housings are separate from one another in a pre-assembly state and configured to he attached to one another in a row direction to form the terminal row,
- wherein a plurality of main housings are separate from one another and can be attached to one another to form one or more terminal rows, and
- wherein the main housings each comprise a base strip module and a connector module that can be attached to the base strip module.

22. The assembly kit according to claim 21, wherein the assembly kit comprises at least one electronics housing to which at least one terminal row can be attached.

* * * * *